United States Patent [19]

Bouadma

[11] Patent Number: 5,304,283
[45] Date of Patent: Apr. 19, 1994

[54] PROCESS FOR PRODUCING A BURIED STRIPE SEMICONDUCTOR LASER USING DRY ETCHING FOR FORMING SAID STRIPE AND LASER OBTAINED BY THIS PROCESS

[75] Inventor: Nouredine Bouadma, Gentilly, France

[73] Assignee: France Telecom Etablissement Autonome De Droit Public, Paris, France

[21] Appl. No.: 840,299

[22] Filed: Feb. 24, 1992

[30] Foreign Application Priority Data

Feb. 26, 1991 [FR] France .................. 91 02272

[51] Int. Cl.$^5$ .......................................... H01L 21/306
[52] U.S. Cl. ..................................... 156/643; 437/129
[58] Field of Search ........................... 156/643; 437/129

[56] References Cited

U.S. PATENT DOCUMENTS

| 4,737,237 | 4/1988 | Chaminant et al. | 156/649 |
| 4,802,187 | 1/1989 | Bouley et al. | 372/96 |
| 4,963,507 | 10/1990 | Amann et al. | 437/129 |
| 5,017,236 | 5/1991 | Moxness et al. | |
| 5,074,955 | 12/1991 | Henry et al. | 156/643 |
| 5,247,954 | 9/1993 | Grant et al. | |

FOREIGN PATENT DOCUMENTS

| 0261943 | 3/1988 | European Pat. Off. | |
| 0292390 | 5/1988 | European Pat. Off. | |
| 2637743 | 10/1988 | France | |
| 208885 | 11/1984 | Japan | 437/129 |
| 220985 | 12/1984 | Japan | 437/129 |
| 45085 | 3/1985 | Japan | 437/129 |
| 194690A | 4/1989 | Japan | |

OTHER PUBLICATIONS

L. D. Bollinger, "Ion Beam Etching with Reactive Gases" Solid State Technology, Jan. 1983, pp. 99–108.
F. F. Y. Wang, ed. *Dry etching for microelectronics, Materials Processing Theory & Practices*, vol. 4., pp. 147–149, North-Holland.
J. R. Lothian, et al "Mask erosion during dry etching of deep features in III–V semiconductor structures" Semiconductor Science Tech vol. 7 pp. 1199–1209 (1992).
S. Wolf, et al. Silicon Processing for the VLSI Era: vol. 1, Process Technology Lattice Press, Sun Set Beach, Calif., (1986) pp. 518 and 532–534.
*Gallium Arsenide Materials, Devices, and Circuits* Editors M. J. Howes & D. V. Morgan; John Wiley & Sons N.Y. (1985) pp. 151–155.
Applied Physics Letters, 57(1990) Oct. 29, No. 18, N.Y. "Buried-Heterostructure Lasers Fabricated By In Situ Processing Techniques" By: Wang et al, pp. 1864–1866.
Electronics Letter May 7, 1987, vol. 23 No. 10 "Low-Threshold GaAs/GaAlAs Buried Heterostructure Laser With An Ion-Beam Etched Quarter Ring Cavity" By: Sansonetti et al.

(List continued on next page.)

Primary Examiner—William A. Powell
Assistant Examiner—Linda J. Fleck
Attorney, Agent, or Firm—Hayes, Soloway, Hennessey, Grossman & Hage

[57] ABSTRACT

A process is disclosed for producing a buried stripe semiconductor laser using dry etching. According to the present invention, a heterostructure is formed by a first epitaxy, during which, on a substrate is deposited a confinement layer having a first doping type, an active layer and a protection layer. The protection layer and the active layer are etched by a reactive ion beam etching method using a gaseous mixture of argon, methane and hydrogen and this takes place down to the confinement layer, so as to form a stripe from the active layer. The stripe is buried by a second epitaxy in a semiconductor layer having a second type of doping which is the opposite of the first. Particular utility is found in the area of optical telecommunications, although other utilities are contemplated.

6 Claims, 1 Drawing Sheet

OTHER PUBLICATIONS

Applied Physics Letters 56(1990) Apr. 23, No. 17, N.Y. "1.5 m GaInAsP/InP Buried-Heteroscruture Laser Diode Fabricated By Reactive Ion Etching", Hydrogen By: Matsui.

Electronics Letters Oct. 26, 1989 vol. 25 No. 22 "Extremely Low Threshold Operation Of 1-5 m GaInAsP-/InP Buried Ridge Stripe Lasers" By S. Gromaire et al pp. 1477-1479.

320 Applied Physics Letters 59(1991) Jul. 1, No. 1 New York "Over 245 mW 1.3 m Buried Ridge Stripe Laser Diodes On N-Substrate Fabricated By The Reactive Ion Beam Etching Technique" By: N. Bouadma et al pp. 22-24.

CW Operation Of GaInAsP Buried Ridge Structure Laser at 1-5 m Grown By LP-MOCVD Electronics Letters Oct. 11, 1984 vol. 20, No. 21, pp. 850-851 by: Blondeau et al.

PROCESS FOR PRODUCING A BURIED STRIPE SEMICONDUCTOR LASER USING DRY ETCHING FOR FORMING SAID STRIPE AND LASER OBTAINED BY THIS PROCESS

BACKGROUND OF THE INVENTION

1. Field of the Invention

The present invention relates to a process for producing a buried stripe semiconductor laser, in which:

a heterostructure is formed by a first epitaxy during which successive deposition takes place on a substrate of a first confinement layer having a first doping type, an active layer and a protection layer, the protection layer and the active layer are etched up to the first confinement layer, so as to form a stripe from the active layer and the stripe is buried by a second epitaxy known as "repeat epitaxy" in a semiconductor layer having a second doping type opposite to the first and forming a second confinement layer.

The present invention also relates to a laser obtained by the process according to the invention.

The invention more particularly applies to the field of optical telecommunications and in particular to the production of double heterostructure semiconductor lasers for links by monomodal optical fibres.

2. Brief Description of Prior Art

Various buried stripe laser structures are already known and reference is e.g. made to:

embedded buried heterostructure (EMBH) with blocking junctions, the flat surface buried heterostructure (FBH), the semi-insulating planar buried heterostructure (SI-PBH) with semi-insulating layers and the buried ridge stripe (BRS) structure with homojunctions or heterojunctions.

The growth processes and the static and dynamic characteristics of said laser structures vary very significantly.

However, the BRS structure would appear to be very promising to the extent that it only requires two successive epitaxy cycles and is suitable for all epitaxy methods such as metalorganic chemical vapour deposition (MOCVD) and molecular beam epitaxy (MBE).

Various known BRS structures are described in documents (1) to (4), which are given at the end of the description and to which reference should be made.

It is also known that Thomson CSF and C.N.E.T. (Centre National d'Etudes des Télécommunications) are at present studying BRS structure lasers emitting at 1.3 and 1.5 micrometer. An example of such BRS structure lasers is diagrammatically shown in FIG. 1.

The known structure shown in FIG. 1 is obtained with the aid of two epitaxy cycles.

In a first epitaxy cycle on a n+ doped InP substrate 2 is formed a first n doped InP confinement layer 4 and then an undoped InGaAsP active layer 6, followed by a p doped InP protection layer having a limited thickness. This is followed by the etching of a stripe over a width of e.g. 2 micrometers up to the first confinement layer 4 and using a bromine-based chemical solution.

A second epitaxy cycle makes it possible to grow again on the stripe a second p doped InP confinement layer 8, followed by a p+ doped InGaAs contact layer 10.

The localization of the electric current on the mesa resulting from the etching is then obtained by the implantation of protons in the contact layer 10 and in the second confinement layer 8, which produces high resistivity regions 12 and 14 on either side of the active stripe formed. Finally, on the contact layer 10 is deposited a platinum layer 16 and then a gold layer 18.

The production process of the BRS structure described with reference to FIG. 1, although interesting in certain respects (particularly for the ease with which it can be carried out and its compatibility with all growth processes, particularly in the vapour phase) still suffers from disadvantages.

Thus, as the etching of the stripe takes place chemically in solution, problems inherent in this procedure arise during the production of the structure, particularly on large surface epitaxied semiconductor plates.

A first problem is the lateral etching of the stripe or underetching, which is characteristic of all isotropic etching operations. In view of the limited width of the mask used for the etching (2 micrometer), this phenomenon leads to a limitation of the etching depth in the material to a few hundred nanometers so as not to excessively reduce the final width of the stripe (which is typically 1.4 micrometer).

A second problem is the lack of uniformity of the etching, particularly over large surfaces where, as has been experimentally shown, chemical etching in solution initially starts on the edges of the submerged sample and spreads towards the centre thereof, thus bringing about a significant stripe depth and width variation between the sample edge and centre.

A third problem results from the fact that chemical etching in solution is known to be highly dependent on several external parameters (particularly the temperature, agitation and brightness), so that the structure obtained is difficult to reproduce.

The present invention aims at obviating the above disadvantages.

SUMMARY OF THE INVENTION

The invention solves the problems of finding a process for producing a buried stripe semiconductor laser applicable to samples having a large surface area, e.g. semiconductor wafers having a diameter of 2" (5 cm) or more, thus permitting mass production of the laser with good uniformity of its characteristics and consequently a reduction to the costs thereof.

To solve this problem, the process for producing a buried stripe semiconductor laser according to the invention is characterized in that the protection layer and the active layer are etched by a dry etching procedure, namely reactive ion beam etching, using a gaseous mixture of methane, hydrogen and argon.

Thus, the invention utilizes the anisotrophy, uniformity and reproducibility properties, which are specific to various dry etching processes.

Due to the absence of underetching effects, the process according to the invention makes it possible to obtain, with a good control, active stripes with widths below 1 micrometer (submicron stripes), thus reducing the threshold current of the lasers produced by this process, which is very important parameter for several applications of the invention and in particular optoelectronic integration.

The dry etching process could be reactive ion etching (RIE), ion beam etching (IBE) or chemical assisted ion beam etching (CAIBE).

However, within the scope of the present invention, the dry etching process is a reactive ion beam etching (RIBE), which has advantages compared with other dry etching processes.

Thus, for example, RIBE makes it possible to independently control the various etching parameters (in particular pressure, accelerating voltage of the ions and angle of incidence of the ion beam), which is not possible with RIE.

Moreover, the use in the present invention of the gaseous mixture of methane, argon and hydrogen is much less toxic for users and much less corrosive for the etching apparatus than other gases (e.g. chlorine).

In the present invention, the second epitaxy can be a vapour phase epitaxy. It can be carried out by metalorganic chemical vapour deposition (MOCVD).

Preferably, the process according to the invention comprises, before the second epitaxy, a short etching of the etched layers.

The reactive ion beam etching process used in the invention can comprise a prior masking stage using a resin layer, e.g. a photosensitive resin layer, of part of the protection layer located above the active layer zone corresponding to the stripe to be formed. The resin is then preferably removed by means of hydrofluoric acid in an ultrasonic bath after etching has taken place.

According to a preferred embodiment of the process according to the invention, the heterostructure is double, the composition of the active layer then being different from the composition of the first confinement layer and the composition of the protection layer.

Thus, it is known that a double heterostructure leads to much lower threshold current densities than those obtained with single heterostructures.

According to a special embodiment of the process according to the invention, the substrate is of $n^+$ doped InP, the first confinement layer of n doped InP, the active layer of InGaAsP, the protection layer of p doped InP and the second confinement layer of InP p doped between $10^{18}$ and $5.10^{18}$ cm$^{-3}$.

BRIEF DESCRIPTION OF THE DRAWINGS

The invention will be better understood from the following illustrative, non-limitative description of embodiments with reference to the attached drawings, wherein show, apart from FIG. 1 which has already been described and which diagrammatically shows a known buried stripe laser.

DETAILED DESCRIPTION OF PREFERRED EMBODIMENTS

Figure 1:
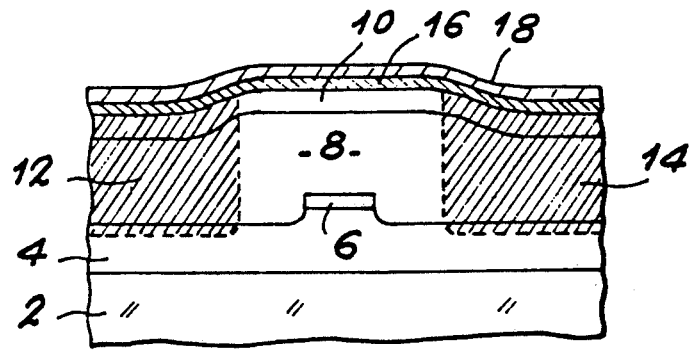
Figure 2:
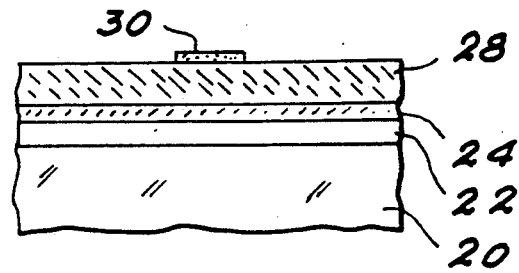
FIGS. 2A to 2D diagrammatically various stages of a particular performance procedure of the process according to the invention. These various stages will be described hereinafter.
Figure 2:
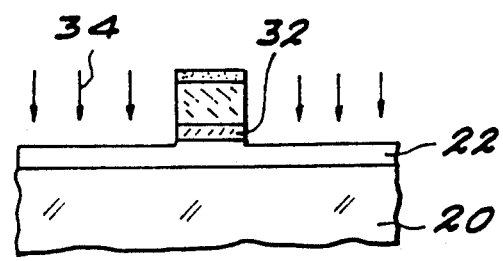
Figure 2:
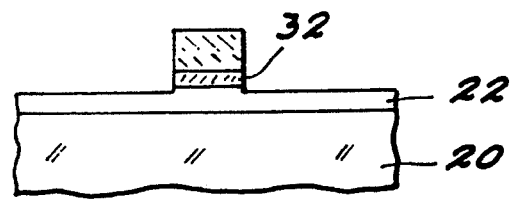
Figure 2:
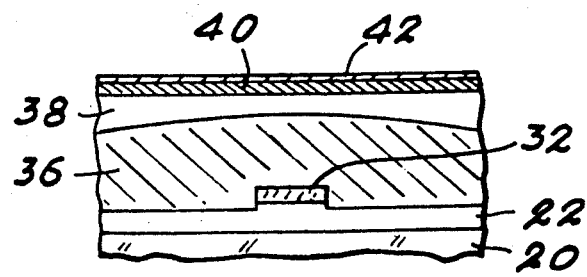

According to FIG. 2A, the first stage is the formation of a double heterostructure by successively depositing by epitaxy on a $n^+$ doped InP substrate 20, a first n doped InP confinement layer 22, an undoped, 110 nm thick InGaAsP active layer 24 and a p doped InP protection layer 28 (e.g. doping taking place with zinc atoms) and having a thickness of 100 nm.

This is followed by the masking of the heterostructure obtained, e.g. using a photosensitive resin, so as to form on the protection layer 28, a 2 micrometer wide and 600 nm to 1 micrometer high pattern 30 of said resin and arranged in the <110> direction of the protection layer 28.

According to FIG. 2B, this is followed by an RIBE-type dry etching of the thus masked heterostructure down to the first confinement layer 22, which gives an active stripe 32 from the thus etched active layer 24.

This etching is carried out in a frame equipped with a Kaufman-type ion source, or an ion cyclotronic source, or an electron cyclotronic resonance (ECR) source, or a RF source.

This etching is carried out under the following experimental conditions for a Kaufman ion source:

etching gas : mixture of argon, hydrogen and methane (this mixture making it possible to etch InP, GaAs and compounds of the latter), energy of the ion beam 34: 300 eV, ion density: 0.250 to 0.550 mA/cm$^2$, angle of incidence of the ion beam 34: 20°, total pressure: $5 \times 10^{-4}$ Torr (approximately $7 \times 10^{-2}$ Pa), respective flow rates of the gases: 10 sccm (cm$^3$ standard per minute) for argon, 20 sccm for hydrogen and 4 sccm for methane (this proportion of the gases could change in the case of using other types of sources), substrate holder rotation speed: 12 r.p.m.

In view of the fact that any dry etching process is characterized by the formation, in the etched material, of defects induced by the accelerated ion beam and that the disturbed material thickness is proportional to the energy of said beam (said thickness being less than 20 nm for an energy of 300 eV), this is followed by slight chemical etching, i.e. having a short duration (approximately 5 seconds) of the thus etched structure, in a non-selective solution with the following volume proportions:

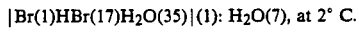

|Br(1)HBr(17)H$_2$O(35)|(1): H$_2$O(7), at 2° C.

This is followed by a check on the photoluminescence of the stripe obtained and of the surface of the first n doped InP confinement layer, in order to ensure a satisfactory etching quality. The resin mask 30 is then removed (FIG. 2C). The removal of this mask causes a problem. Thus, the use of a reactive gas based on a hydrocarbon, such as e.g. methane, makes it possible to etch a semiconductor material such as InP. However, during etching, a polymer deposition takes place on all material other than InP or its derivatives and in particular on the resin mask, so that it is difficult to remove the latter using conventional solvents such as e.g. acetone.

The use of an oxygen plasma for the removal makes it possible to solve this problem, but unfortunately a photoluminescence loss of InP and the quaternary compound InGaAsP was found whenever such a resin removal process was used.

To obviate this disadvantage and remove in a simple manner the resin mask 30 without damaging the etched heterostructure surface, in the embodiment of the invention use is made of a hydrofluoric acid solution in an ultrasonic tank for a period of 2 minutes. This is followed by cleaning of the etched heterostructure surface using conventional procedures.

For this purpose, use is firstly made of a hot cleaning of the process and this successively takes place in trichloroethylene, acetone and isopropanol for 2 minutes for each of these products, followed by a slight etching for 1 minute of said surface in sulphuric acid and then deoxidation in hydrofluoric acid for 30 seconds.

According to FIG. 2D, this is followed by a second epitaxy cycle known as "repeat epitaxy", e.g. using MOCVD for growing on the etched structure a second $2 \times 10^{18}$ cm$^{-3}$ p doped InP confinement layer 36 using zinc atoms (this strong doping being intended to limit the lateral leakage currents), which buries the active stripe 32, followed by a p+ doped InGaAs contact layer 38 on said second confinement layer 36. The contact layer 38 is doped with $1 \times 10^{19}$ cm$^{-3}$ zinc atoms.

On the said contact layer 38 is then deposited a platinum layer 40, which is annealed at 450° C. for 2 min. and then a gold layer 42 is deposited on the layer 40.

The uniformity of the RIBE etching process under the aforementioned experimental conditions has been demonstrated. For this purpose 2 micrometer wide and 500 nm deep parallel stripes were etched on a diameter 50 mm InP sample.

By plotting the variations of the width and the depth of each stripe as a function of the position thereof on the sample, it was found that a very good uniformity was obtained over the entire surface of the sample and that the width of the stripe after etching is virtually equal to its width before etching (approximately 2 micrometers). This permits the production of submicron stripes with a very good control.

In addition, BRS-type laser structures were produced with the aid of the process of the example described hereinbefore and it was found that these lasers had performance characteristics superior to those obtained with BRS-type laser structures produced using known processes.

The output power/pulse injected current (P/I) characteristics of several BRS laser structures produced as in the aforementioned embodiment have a good uniformity as regards threshold current and external quantum yield.

A study was also made of the continuous P/I characteristic of one of these lasers and it was found that there was a maximum output power exceeding 90 mW, which shows a good efficiency of the InP electric junctions on either side of the stripe and confirms the good quality of the etching process used.

Moreover, the dynamic behaviour of these lasers was revealed by the measurement of their frequency responses. A passband at −3 dB of 17 GHz was measured.

It was also found that the curve corresponding to this passband was of the roll off type, which demonstrates that the stray or parasitic elements of the structure are limited (stray capacitance of approximately 5 to 6 pF and series resistance of approximately 1.5 ohm).

These low series resistance and stray capacitance values are essentially due to the high doping of the layers with p doped InP and p+ doped InGaAs (respectively $2 \times 10^{18}$ and $1 \times 10^{19}$ cm$^{-3}$).

Obviously, the active layer 24 could have a quantum well structure instead of being made from a single semiconductor material (InGaAsP in the embodiment described).

Documents (1) to (4) referred to at the beginning of the description are listed below:

(1) Article by R. Blondeau et al., Electronics Letters, Vol. 20, pp. 850/1, 11.10.1984.

(2) FR-A-2587852 entitled "Process for producing a buried stripe semiconductor laser with or without a diffraction grating and laser obtained by this process", G. Chaminant, J. Charil, J. C. Bouley, cf. also U.S. Pat. No.-4,737,237.

(3) French patent application 8607064 of 16.5.1986 entitled "Constantly tuneable wavelength, distributed reaction semi-conductor laser", J. C. Bouley, P. Correc, cf. also U.S. Pat. No. 4,802,187.

(4) FR-A-2637743 entitled "Blocking layer, buried stripe semi-conductor laser and process for producing said laser", J. C. Bouley and C. Kazmierski.

I claim:

1. A process for producing a buried stripe semiconductor laser in which:

a heterostructure is formed by a first epitaxy during which successive deposition takes place on a substrate of a first confinement layer having a first doping type, an active layer and a protection layer, using a dry etching procedure, the protection layer and the active layer are etched down to the first confinement layer, so as to form a stripe from the active layer and the stripe is buried by a second epitaxy in a semiconductor layer having a second doping type opposite to the first, forming a second confinement layer, and also forming a contact layer having the same doping type as the second confinement layer upon said second confinement layer, a conductive layer being formed on said contact layer, and the protection layer and the active layer are etched by reactive ion beam etching using a gaseous mixture of argon, methane and hydrogen, said reactive ion beam etching comprising a prior masking stage, using a photoresist layer, of part of the protection layer located above a zone of the active layer corresponding to the stripe to be formed, said photoresist layer being removed by means of hydrofluoric acid in an ultrasonic tank following said beam etching.

2. A process according to claim 1, wherein the second epitaxy is a vapour phase epitaxy.

3. A process according to claim 2, wherein the second epitaxy is performed by metalorganic chemical vapour phase deposition.

4. A process according to claim 1, and also comprising, before the second epitaxy, a brief etching of the etched layers.

5. A process according to claim 1, wherein use is made of a double heterostructure, composition of the active layer then being different from composition of the first confinement layer and composition of the protection layer.

6. A process according to claim 5, wherein the substrate is of n+ doped InP, the first confinement layer of n doped InP, the active layer of InGaAsP, the protection layer of p doped InP and the second confinement layer of InP p doped between $10^{18}$ and $5 \times 10^{18}$ cm$^{-3}$.

* * * * *